United States Patent [19]
Hong

[11] Patent Number: 5,976,977
[45] Date of Patent: Nov. 2, 1999

[54] PROCESS FOR DRAM CAPACITOR FORMATION

[75] Inventor: Gary Hong, Hsinchu, Taiwan

[73] Assignee: United Microelectronics Corp., Taiwan

[21] Appl. No.: 08/975,494

[22] Filed: Nov. 21, 1997

[51] Int. Cl.$^6$ ................................................. H01L 21/8242
[52] U.S. Cl. .......................... 438/689; 438/697; 438/704; 438/723; 438/724
[58] Field of Search ..................................... 438/689, 697, 438/704, 723, 724, 699

[56] References Cited

U.S. PATENT DOCUMENTS

| | | | |
|---|---|---|---|
| 5,429,956 | 7/1995 | Shell et al. | 437/29 |
| 5,491,103 | 2/1996 | Ahn et al. | 437/152 |
| 5,514,247 | 5/1996 | Shan et al. | 156/643 |

*Primary Examiner*—Benjamin Utech
*Assistant Examiner*—Lan Vinh
*Attorney, Agent, or Firm*—Rabin & Champagne, PC

[57] ABSTRACT

A DRAM capacitor is formed using a process that avoids high temperature processing steps and which emphasizes low cost processes. An interlayer dielectric, typically CVD TEOS oxide, is provided over the transfer FET and bit line contact of the DRAM cell. The interlayer dielectric is planarized and an etch stop layer is provided over the planarized surface of the etch stop layer. A contact via is formed to expose a source/drain region for the transfer FET. Doped polysilicon is provided to fill the contact via and to form a first layer of doped polysilicon over the etch stop layer. The first polysilicon layer is patterned to form a plate aligned over the contact via using a first photoresist mask and etching. The first photoresist mask is left in place over the plate and a first layer of selective oxide is deposited over the etch stop layer so that the first selective oxide layer does not deposit over the photoresist mask. The first photoresist mask is then removed to expose the surface of the plate and a second doped polysilicon layer is provided over the first selective oxide layer and in contact with the first polysilicon plate. A second photoresist mask is provided over the second polysilicon layer and the second polysilicon layer is etched to define fins extending upward and outward from the first polysilicon plate. This process is repeated to form as complex of a structure for the lower capacitor electrode as is desired.

26 Claims, 6 Drawing Sheets

PROCESS FOR DRAM CAPACITOR FORMATION

BACKGROUND OF THE INVENTION

1. Field of the Invention

The present invention relates to the formation of high density integrated circuits and, more particularly, to the formation of high density dynamic random access memories.

2. Description of the Related Art

There is a continuing trend toward increasing the storage density of integrated circuit memories to provide increased levels of data storage on a single chip. Higher density memories provide storage that is generally more compact and is often cheaper on a per bit basis than an equivalent amount of storage provided on plural chips. It has generally been possible to provide these higher levels of storage at equivalent or improved levels of performance as compared to the earlier, less dense memory chips. Historically, the density of integrated circuit devices has been increased in part by decreasing the size of structures such as wiring lines and transistor gates as well as by decreasing the separation between the structures that make up the integrated circuit device. Reducing the size of circuit structures is generally referred to as decreasing the "design rules" used for the manufacture of the integrated circuit device.

In dynamic random access memories (DRAMs), information is typically stored by selectively charging or discharging each capacitor of an array of capacitors formed on the surface of a semiconductor substrate. Most often, a single bit of binary information is stored at each capacitor by associating a discharged capacitor state with a logical zero and a charged capacitor state with a logical one, or vice versa. The surface area of the electrodes of the memory capacitors determines the amount of charge that can be stored on each of the capacitors for a given operating voltage, for the electrode separation that can reliably be manufactured, and for the dielectric constant of the capacitor dielectric used between the electrodes of the charge storage capacitor. Read and write operations are performed in the memory by selectively coupling the charge storage capacitor to a bit line to either transfer charge to or from the charge storage capacitor. The selective coupling of the charge storage capacitor to the bit line is accomplished using a transfer field effect transistor (FET). A contact between the bit line and the transfer FET is typically made to one of the source/drain electrodes of the transfer FET and the charge storage capacitor is typically formed in contact with the other of the source/drain electrodes of the transfer FET. Word line signals are supplied to the gate of the FET to connect the lower electrode of the charge storage capacitor through the transfer FET to the bit line contact facilitating the transfer of charge between the charge storage capacitor and the bit line.

Applying reduced design rules to a DRAM reduces the substrate surface area that can be devoted to the charge storage capacitor of the DRAM. Thus, applying reduced design rules to conventional planar capacitor designs reduces the amount of charge (i.e., capacitance) that can be stored on the charge storage capacitor. Reducing the amount of charge on the capacitor leads to a variety of problems, including the potential loss of data due to greater susceptibility to decay mechanisms and to charge leakage. This greater susceptibility to charge loss may cause the DRAM to require more frequent refresh cycles, which are undesirable since the memory may be unavailable for data storage and readout transactions during refresh activities. In addition, reduced levels of charge storage might require more sophisticated data readout schemes or more sensitive charge sensing amplifiers. Thus, modern DRAMs require increased levels of capacitance in reduced substrate area DRAM cells. To this end, a variety of very complex capacitor structures having three dimensional charge storage surfaces have been proposed. In general, these complex capacitor structures are difficult to manufacture.

SUMMARY OF THE PREFERRED EMBODIMENTS

It is accordingly an object of the present invention to provide a more manufacturable DRAM incorporating a high dielectric constant dielectric material.

One aspect of the present invention provides a method of making an integrated circuit device on a substrate with a transfer field effect transistor on a surface of the substrate, the transfer field effect transistor having first and second source/drain regions. The transfer field effect transistor is covered with a first layer of insulating material. A first layer of conductive material, connected to the first source/drain region, is provided over the first layer of insulating material. A first mask is provided on the first layer of conductive material. The first layer of conductive material is removed where exposed by the first mask. Selective deposition of a second layer of insulating material is performed over the substrate, the selective deposition providing portions of the second layer of insulating material around the first mask and over portions of the substrate above which the first layer of conductive material was removed, the selective deposition leaving an upper surface of the first mask not covered by the second layer of insulating material. The first mask is removed to expose a surface of a remaining portion of the first layer of conductive material, the second layer of insulating material having an opening around the remaining portion of the first layer of conductive material. A second layer of conductive material is provided on the first layer of conductive material and over the second layer of insulating material, which is then patterned in a manner that exposes a portion of the second layer of insulating material. The second layer of insulating material is removed from below the second layer of conductive material, a dielectric layer is formed over exposed surfaces of the first layer of conductive material and the second layer of conductive material, and a conductive upper electrode is formed over the dielectric layer.

According to another aspect, an integrated circuit device is formed on a surface of a substrate including a transfer field effect transistor having first and second source/drain regions. The transfer field effect transistor is covered with a first insulating layer. An etch stop layer is provided over the first insulating layer and a contact via is opened through the etch stop layer and through the first insulating layer to expose the first source/drain region. A vertical interconnect is provided within the contact via. A first polysilicon layer is provided over the etch stop layer, with the first polysilicon layer connected to the first source/drain region through the vertical interconnect. A first mask is provided on the first polysilicon layer and the first polysilicon layer is etched using the first mask. Selective deposition of a second insulating layer is performed over the substrate, the step of selectively depositing leaving an upper surface of the first mask not covered by the second insulating layer. The first mask is removed to expose a surface of a remaining portion of the first polysilicon layer, the second insulating layer having a first opening around the remaining portion of the first polysilicon layer. A second polysilicon layer is deposited on the first polysilicon layer and over the second insulating layer. The second polysilicon layer is patterned to expose a portion of the second insulating layer. The second insulating layer is removed from below the second polysilicon layer using the etch stop layer to limit the step of removing the second insulating layer. A dielectric layer is formed over exposed surfaces of the first polysilicon layer material and the second polysilicon layer and a conductive upper electrode is formed over the dielectric layer.

DETAILED DESCRIPTION OF THE PREFERRED EMBODIMENTS

According to particularly preferred embodiments, the present invention forms a DRAM with high capacitance charge storage capacitors using a process that reduces the number of conventionally necessary processing steps and which emphasizes low cost processes. A DRAM cell is defined by forming a transfer FET and a bit line contact in a capacitor over bit line configuration. An interlayer dielectric, typically CVD TEOS oxide, is provided over the transfer FET and bit line contact. The interlayer dielectric is planarized and an etch stop layer is provided over the planarized surface of the etch stop layer. A contact via is formed to expose a source/drain region of the transfer FET. Doped polysilicon is provided to fill the contact via with a conductive vertical interconnect and to form a first layer of doped polysilicon over the etch stop layer. The first polysilicon layer is patterned to form a plate aligned over the vertical interconnect. The first photoresist mask used to form the first polysilicon plate is left in place over the plate and a first layer of oxide is selectively deposited over the etch stop layer so that the first selective oxide layer does not deposit over the photoresist mask. The first photoresist mask is then removed to expose the surface of the plate and a second doped polysilicon layer is provided over the first selective oxide layer and in contact with the first polysilicon plate. A second photoresist mask is provided over the second polysilicon layer and the second polysilicon layer is etched to define fins extending upward and outward from the first polysilicon plate. Selective oxide is deposited for a second time, the second photoresist mask is removed and a third doped polysilicon layer is provided over the exposed surface of the second polysilicon layer and over the second selective oxide layer. A third photoresist mask is provided over the third polysilicon layer and the third polysilicon layer is patterned. The second and the first selective oxide layers are removed, preferably in a wet etching processing process which uses the etch stop layer to limit the wet etching process. Capacitor formation proceeds by providing a capacitor dielectric layer and then an upper capacitor electrode.

Figure 11:
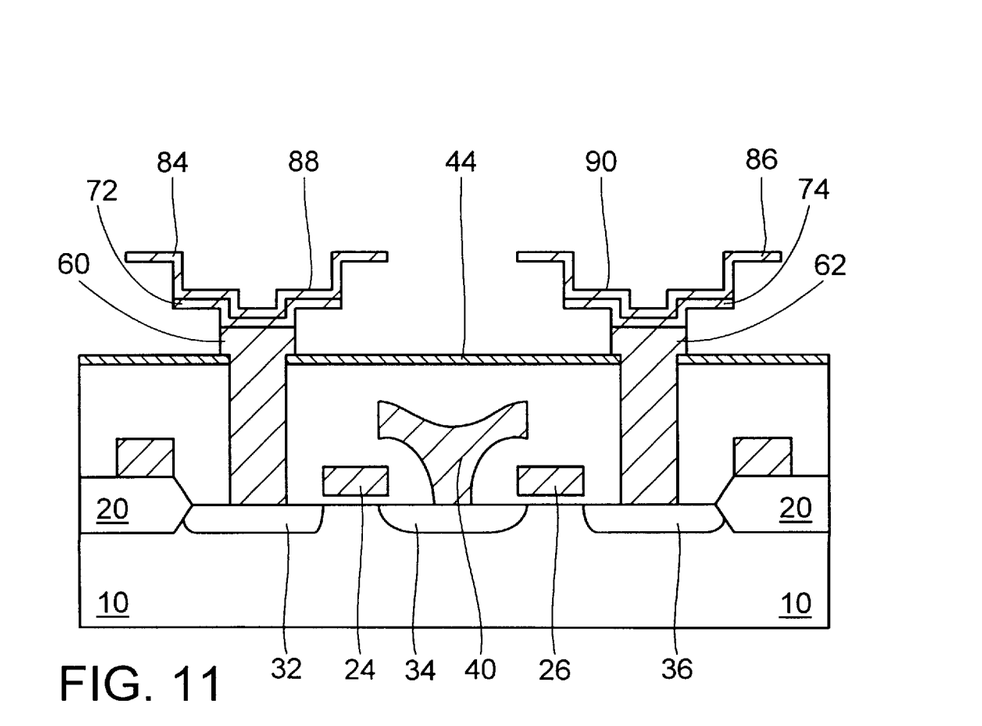

The result of this exemplary process flow is a stepped and finned lower electrode for a charge storage capacitor, such as that shown in FIG. 11, produced using a reduced number of deposition and etching steps. These factors are significant, since each deposition and etching step requires time in a deposition or etching system. Because modern deposition and etching systems are expensive, the time a wafer spends in such systems translates into higher costs for the circuits formed on the wafer. Deposition steps, such as the repeated CVD oxide or nitride deposition steps conventionally used in forming a stacked or finned capacitor electrode require substrate temperatures of at least about 500°–600° C. Repeated exposures to even these temperatures are undesirable and the necessity to heat and stabilize a wafer at these temperatures introduces additional delays to the process. The additional and often prolonged etching steps conventionally performed in forming stacked or finned capacitor electrodes tend to damage the polysilicon that is exposed to the energetic ions of the etch environment. Avoiding such etching steps should improve the internal conductivity of the lower capacitor electrodes.

The capacitor formation process of the present invention is particularly facilitated by the liquid phase deposition of silicon oxide. Liquid phase deposition of oxide is selective in that it does not deposit on the preferred photoresist mask material. Higher temperature oxide deposition processes, such as conventional CVD or plasma enhanced CVD, are poorly compatible with the use of photoresist in the manner allowed by the present invention. At the higher temperatures typical of conventional oxide deposition processes, photoresist would be consumed by the oxide deposition environment and so could not be used as a mask material. To use CVD oxide, rather than liquid phase deposited oxide, it is instead desirable to use plasma cured photoresist, which is more compatible with the oxidizing environment of the conventional CVD oxide deposition process. The use of photoresist, which is spun on and annealed using ultraviolet radiation or comparatively low temperature anneals, and the liquid phase deposition of oxide allows the definition of the oxide structures on which the stepped and finned capacitor structure using low temperature processes that do not require access to deposition equipment. Another advantage of the use of liquid phase oxide deposition is that it naturally provides a planar surface.

Figure 1:
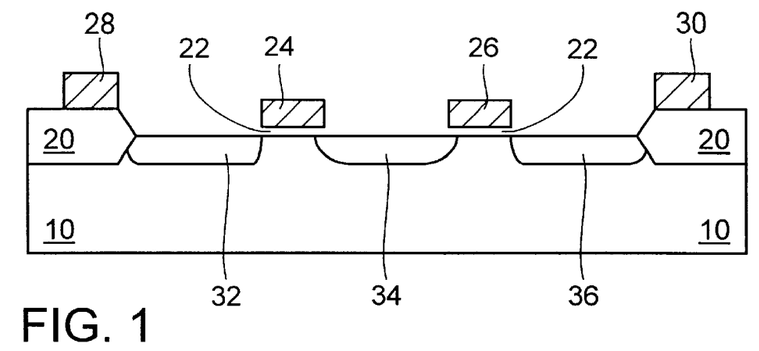
FIGS. 1–12 illustrate steps in forming a DRAM in accordance with preferred embodiments of the present invention.
Figure 2:
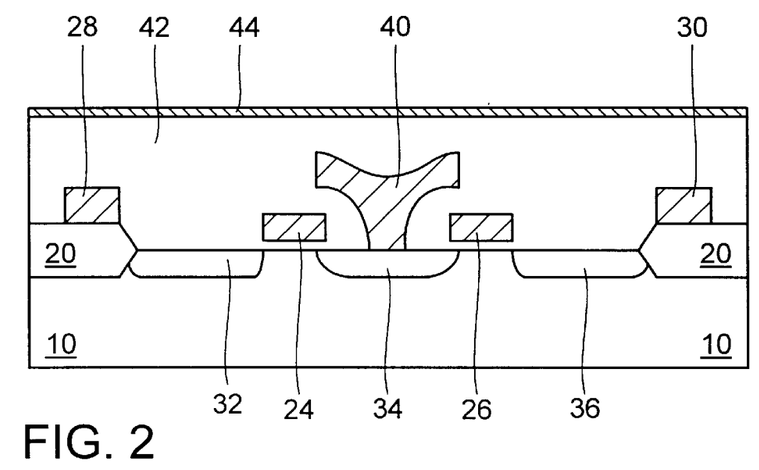
Figure 3:
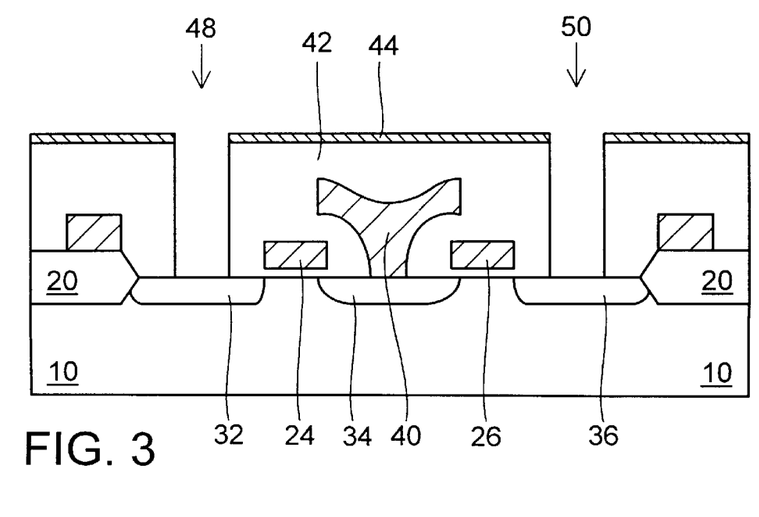
Figure 4:
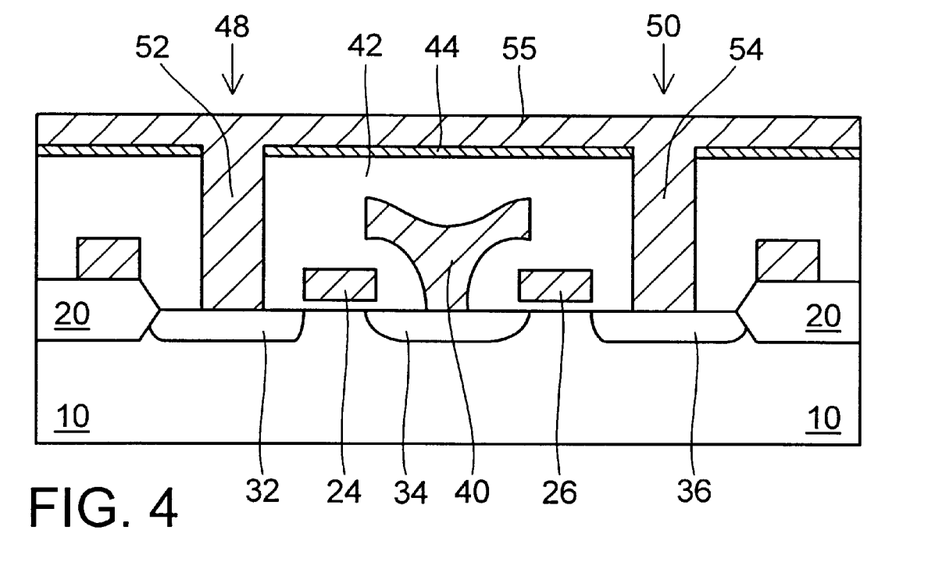
Figure 5:
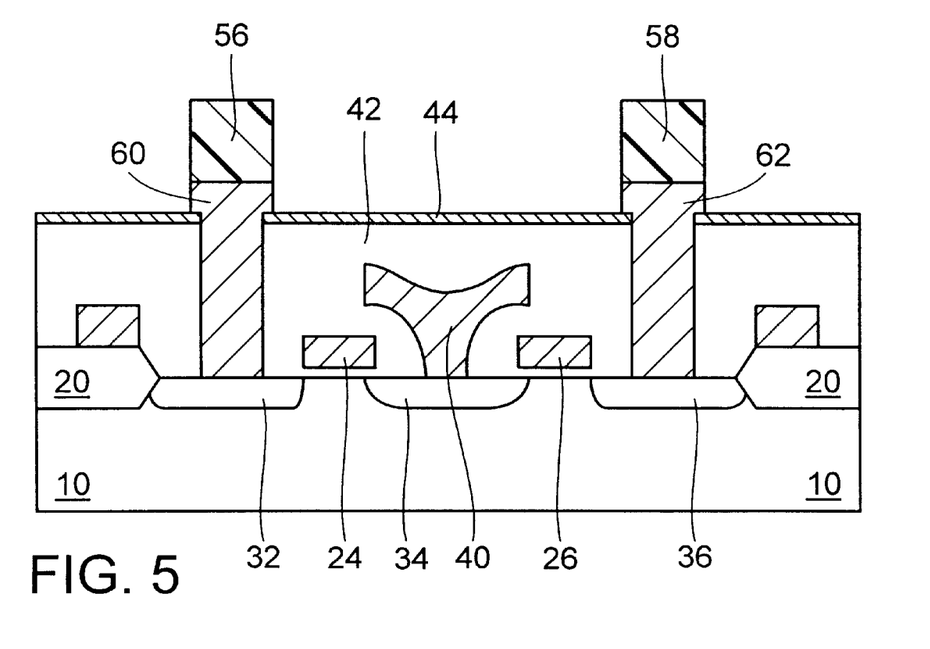

Particularly preferred embodiments of the present invention are now described with reference to FIGS. 1–12. Many aspects of the manufacture of DRAMs are conventional and well known to those practicing in the art. As such, the following discussion omits certain of the details of the manufacturing process and presents in summary still other aspects of the manufacturing process to better emphasize the distinctive teachings of the present invention. FIG. 1 shows in schematic cross-section two memory cells of a DRAM at an intermediate stage of manufacture. Each of the DRAM cells incorporates a transfer field effect transistor (FET) with one source/drain region of the transfer FET connected to the lower electrode of a charge storage capacitor. The two transfer FETs share a common source/drain region that serves as a common bit line contact for the two DRAM cells in the illustrated capacitor over bit line configuration. The illustrated DRAM cells arc formed on a P-type substrate 10 which has on its surface an array of field oxide device isolation regions 20 that provide isolation between the various memory cells and devices of the DRAM. The device isolation regions might be formed using a modified local oxidation of silicon (LOCOS) method, as schematically illustrated, or might be formed as shallow trench isolation structures. Shallow trench isolation structures might be formed by etching trenches into the substrate, refilling the trenches with oxide in a chemical vapor deposition (CVD) process, and planarizing the surface of the device in a chemical mechanical polishing (CMP) process.

Formation of the transfer FETs for the illustrated DRAM cells commences by growing a gate oxide layer 22 on the active device region between the field oxide regions 20. The gate oxide layer 22 may be grown on the surface of the substrate typically to a thickness of about 30–200 Å by a thermal oxidation process in an oxygen environment at a temperature of 800–1000° C. Soon after the gate oxide layer is grown, a layer of polysilicon is deposited by low pressure chemical vapor deposition (LPCVD) over the surface of the device to a thickness of 1000–3000 Å and more preferably to a thickness of approximately 1500–2500 Å. This polysilicon layer will be incorporated into the transfer FET gate electrodes 24, 26 and wiring lines 28, 30 shown in FIG. 1. The gate electrode polysilicon layer is either doped in situ during deposition or by ion implantation, typically using arsenic or phosphorus, followed by annealing in the conventional fashion. A layer of a metal or metal silicide might then be provided over the surface of the polysilicon layer to reduce the resistivity of the gate electrode and wiring line conductors. The metal layer is preferably tungsten silicide (WSi$_x$) or titanium silicide (TiSi$_x$) having a thickness of about 1500 Å which is preferably deposited directly by chemical vapor deposition or by using sputtering or another physical vapor deposition technique. After the silicide layer is provided on the polysilicon layer, a layer of silicon oxide is deposited over the suicide layer, typically by CVD to a thickness on the order of 500–3000 Å. This oxide layer protects the gate electrode during subsequent processing steps and may be used as an etch stop for a second level polysilicon, bit line etching process in some embodiments of the invention.

The gate electrode structure of silicon oxide over a layer of conductor including a layer of polysilicon is then patterned using conventional photolithography to form an array of gate electrodes consisting of a lower layer of polysilicon 24, 26 covered by an optional layer of tungsten silicide or another refractory metal silicide (not shown), which in turn is covered by oxide layer (not separately shown). It should be noted that both more and less complicated gate electrode structures and wiring line structures might be used. The figures illustrate a simple gate electrode structure including a single layer of polysilicon. Similarly, the wiring lines include a lower layer of polysilicon 28, 30 which might be covered by a layer of tungsten silicide or another refractory metal silicide and covered by an oxide layer. Moderately doped portions of source/drain regions 32, 34, 36 are formed by ion implantation self-aligned to the gate electrodes 24, 26 and device isolation regions 20 in the conventional manner. In most DRAM applications, it is preferred to not utilize an LDD structure for the source/drain regions, particularly for the capacitor contacts, and instead to use a single doping to produce more uniformly doped source/drain regions.

After the transfer FETs and wiring lines are formed, a bit line contact for the two illustrated DRAM cells is provided. A layer of silicon oxide is deposited by chemical vapor deposition (CVD) to a thickness of, for example, 1000–2000 Å. A bit line contact mask is provided which exposes the device over the source/drain region where the bit line contact is formed. The silicon oxide layer is then etched back within the mask opening to expose the source/drain region 34 and to form spacers alongside the gate electrodes 24, 26. Oxide etch back is preferably performed in a reactive ion etching (RIE) process using an etchant including ions derived from CF$_4$ in a plasma environment. The spacers left on the gate electrodes 24, 26 will insulate the gate electrodes 24, 26 from the bit line contact in the illustrated capacitor over bit line configuration. Typically, the sidewall spacer etching process will remove the gate oxide from the surface of the source/drain region 34 that forms the bit line contact for the illustrated DRAM cells. If some residue of the gate oxide layer remains over the source/drain region 34 after the spacer etch, it is preferred that the surface of the source/drain region be cleaned of such residue prior to bit line contact to the source/drain region 34. The bit line contact mask is then removed. A layer of polysilicon is deposited over the device in contact with the common source/drain region 34. This bit line contact polysilicon layer might be doped in situ during deposition or by later ion implantation and annealing. In many instances, it is preferred to provide a fairly heavy implantation to this polysilicon layer, followed by an anneal that causes additional N-type dopants to diffuse from the polysilicon into the source/drain region 34 that serves as the bit line contact. A similar result might be obtained by simply implanting impurities into the source/drain region 34, but this method is less favored because it can introduce defects to the source/drain region 34 of a type that can increase leakage. The layer of polysilicon is then patterned to define the bit line contact 40 shown in FIG. 2. As is conventional, the bit line contact can be laterally defined by providing a photoresist mask over the bit line contact polysilicon layer and then etching using a chlorine etch chemistry in a dry etching process.

An interlayer dielectric layer 42 is then provided over the transfer FETs and bit line contact. It is particularly preferred that the interlayer dielectric 42 be provided with a planarized surface to facilitate the various photolithography and etching processes used in the formation of the charge storage surfaces of the lower electrodes of the DRAM charge storage capacitors formed according to the present invention. As such, it is preferred that the interlayer dielectric 42 be deposited, for example, in a CVD process from a tetra-ethyl-orthoxy-siloxane (TEOS) source gas, to a thickness sufficient to allow a planarization process. Preferably, planarization will be accomplished by chemical mechanical polishing (CMP). As such, the CVD TEOS oxide might be deposited to a thickness of between about 2000–10000 Å or more, depending upon the topography of the transfer FETs and bit line contact of the DRAM cell. Polishing is then performed to achieve a planarized surface for the interlayer dielectric 42. Next, an etch stop layer is provided over the surface of the oxide interlayer dielectric 42. This etch stop layer is preferably used as an etch stop both for polysilicon dry etch processes and either a dry or wet etch process for removing an oxide layer. As such, an appropriate etch stop layer might be formed from silicon nitride, although other materials might be used and it is, of course, possible to use other combinations of interlayer dielectrics and etch stop layers. For the illustrated embodiment of the invention, the etch stop layer is formed by depositing a silicon nitride layer 44 by CVD to a thickness of between 100–500 Å.

Vias 48, 50 (FIG. 3) to the capacitor electrode contacts, source/drain regions 32, 36, are next defined through the etch stop layer 44 and the interlayer dielectric 42. A photoresist via etch mask is provided using conventional photolithography. Etching is performed to expose the source/drain regions 32, 34. The nitride etch stop layer 44 might be etched using dry etching and an etchant derived from a source gas including, for example, SF$_6$. The oxide interlayer dielectric 42 might be etched using an etchant derived from a source gas including, for example, CF$_4$, producing the structure illustrated in FIG. 3.

The vias are filled with a conductive vertical interconnect that connects the source/drain contacts 32, 36 of the respective transfer FETs to the lower capacitor electrodes. This is accomplished by depositing a layer of polysilicon over the device using LPCVD, with doping preferably provided to the deposited polysilicon in situ during deposition by the addition of phosphine or arsine gas to the LPCVD deposition environment. The polysilicon layer is deposited so as to fill the vias 48, 50, providing conductive vertical interconnects 52, 54 extending from the source/drain regions 32, 36. In situ doping is preferred in doping the vertical interconnects 52, 54 to minimize the extent of diffusion of impurities away from source/drain region 32, 36 and to minimize the level of diffusion of impurities from the interconnects 52, 54 into the source/drain regions 32, 36. Deposition of this polysilicon layer is continued to provide a first polysilicon layer on the etch stop layer 44. Preferably, the deposition provides a polysilicon layer 55 that extends above the surface of the etch stop layer 44 by about 500–1500 Å to elevate the bottom surface of the lower capacitor above the etch stop layer 44 to facilitate subsequent processing. If the resulting polysilicon layer 55 is not sufficiently planar, it may be desirable to planarize the layer 55 using, for example, chemical mechanical polishing.

The first polysilicon layer 55 is patterned to define first polysilicon plates 60, 62 on the etch stop layer aligned over the vertical interconnects. Each of the first polysilicon plates are electrically connected to the appropriate source/drain regions 32, 36 of the respective transfer FETs. Plates 60, 62 are defined using a first etching mask 56, 58 and an etchant derived in a plasma process from a mixture of source gases including HCl. Most preferably, the mask material that is used in defining the lateral extent of the first polysilicon plates is photoresist and extends a significant distance (at least about 1000–2000 Å) above the plates 60, 62. The preferred photoresist masks 56, 58 are preferably left in place to partially define the lateral extent of selective oxide layers formed around the first polysilicon plates 60, 62. Subsequent deposition of the first selective oxide layer will form openings aligned with the edges of the first polysilicon plates 60, 62 and extending above the upper surfaces of the plates. For the preferred liquid phase deposition of the oxide layer, conventionally exposed photoresist can be used as the masking material. If a higher temperature selective deposition process is used, it might be necessary to use a plasma curing process for the photoresist mask, particularly if there is oxygen in the deposition environment.

Figure 6:
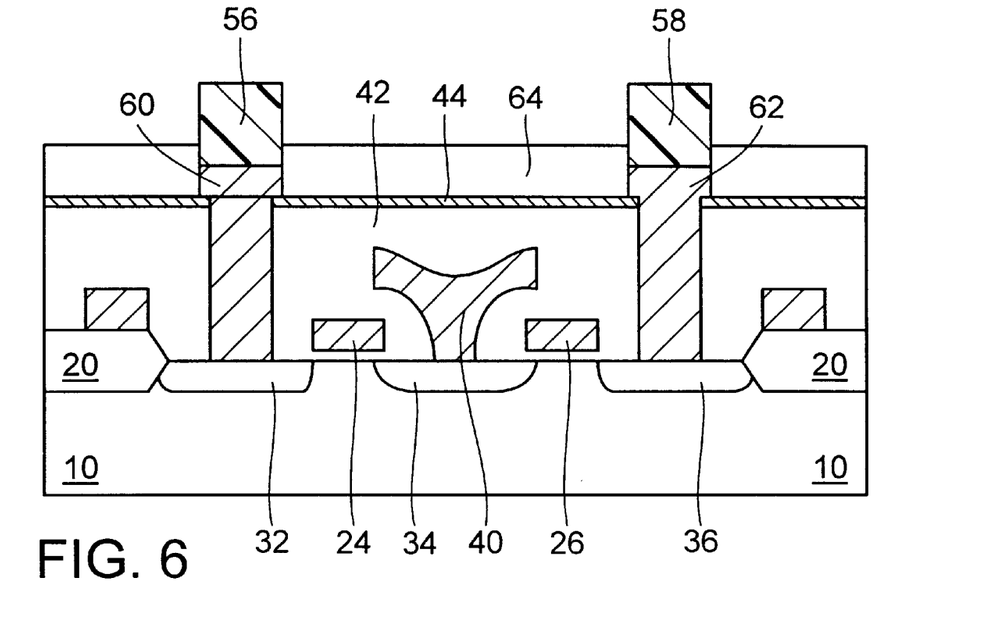

Referring now to FIG. 6, a liquid phase deposition (LPD) process is now used to selectively fill the areas over the etch stop layer 44 between the first polysilicon plates 60, 62 and photoresist mask elements 56, 58 with a first selective oxide layer 64. The liquid phase deposition of the silicon oxide is performed in a supersaturated solution of hydroflurosilic acid ($H_2SiF_6$). The method more specifically involves dissolving a pure silicon oxide power, such as formed by the sol-gel method from tetraethoxysilane (TEOS), in a $H_2SiF_6$ acid solution to form a saturated solution at about 25° C. For example, the hydrofluorosilic acid being 40 percent by weight in aqueous solution is manufactured by the Morita Kagaku Kogyo Co. Ltd. of Japan. The saturated solution is then transferred to a Teflon vessel for film deposition and maintained at a temperature of between about 33 to 37° C. by a water bath. The substrates are then immersed in the solution for liquid phase deposition (LPD). During the deposition an aqueous solution of boric acid ($H_3BO_3$) is continuously added by a controlled drip rate and magnetic stirring to maintain the supersaturated condition. Preferably, the first selective oxide layer 64 is deposited in a timed process step so that a sufficient thickness of oxide is deposited to extend above the surface of the first polysilicon plates 60, 62. The extent by which the openings in the first selective oxide layer 64 extends above the first polysilicon plates 60, 62 will define the extent of a step in the lower capacitor electrode that provides a desirable increase in the surface area used for charge storage. Consequently, it is desirable for the first selective oxide layer to a have a thickness of at least 500 Å greater than the thickness of the first polysilicon plates 60, 62. The first photoresist mask is then stripped or removed by ashing.

Figure 7:
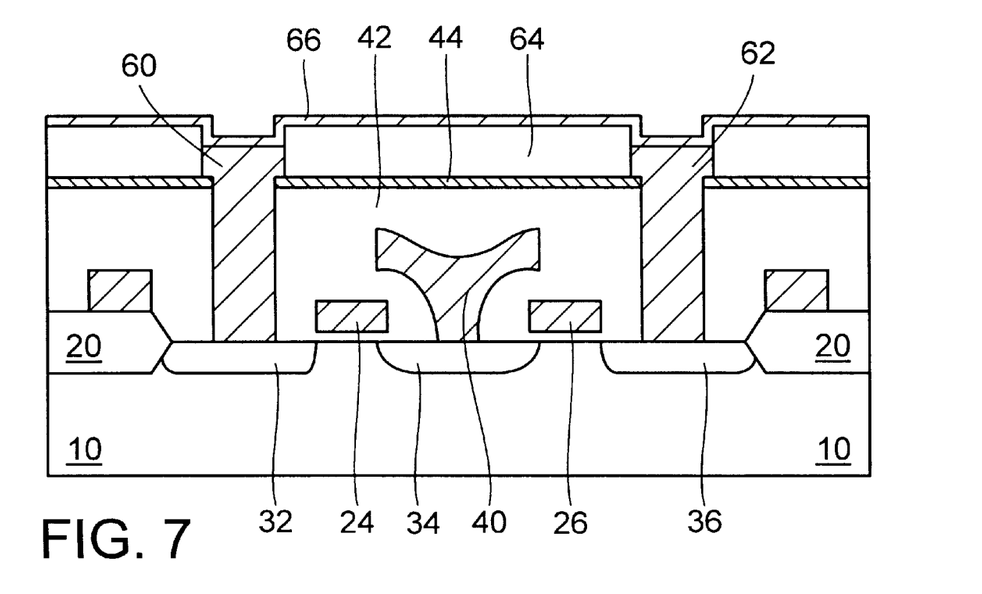

A second doped polysilicon layer 66 is then provided over the first selective oxide layer 64, preferably by LPCVD with in situ doping. The second polysilicon layer 66 is preferably thin so that the second polysilicon layer conformally follows the topography of the opening in the first selective oxide layer, without filling the opening. This will allow the second polysilicon layer and a subsequently deposited third polysilicon layer to form an interlocking step shape. It is preferred that the second polysilicon layer be sufficiently thick as to support fins extending away from the core of the polysilicon lower electrode. The second polysilicon layer might, for example, be between about 500–1000 Å thick. The resulting structure is shown in FIG. 7.

Figure 8:
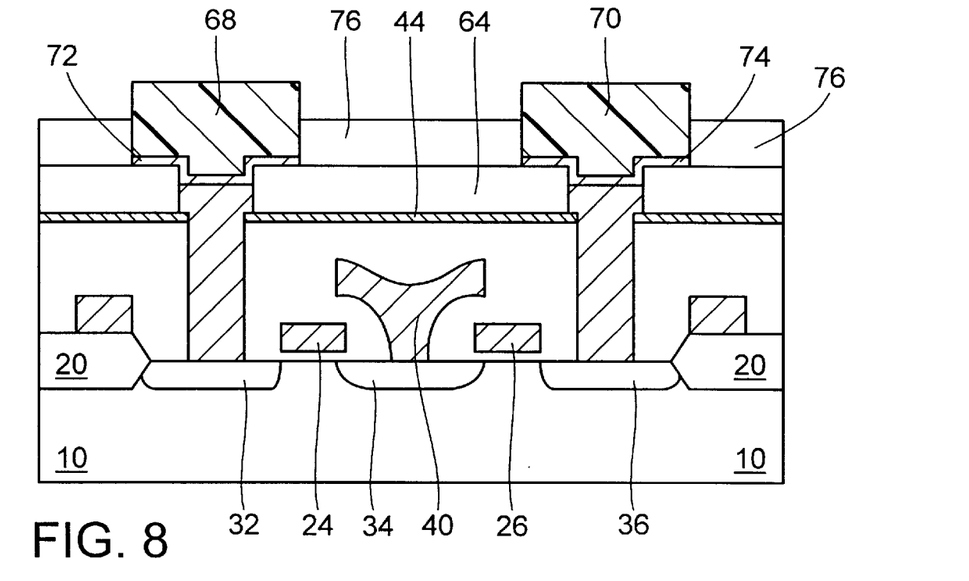

Next, a second photoresist mask having mask elements 68, 70 is provided on the second polysilicon layer 66. Most preferably, the photoresist mask elements 68, 70 are made wider than the first polysilicon plates, as shown in FIG. 8. Etching is performed to define second polysilicon fin elements 72, 74 from the second polysilicon layer 66, leaving the photoresist mask elements 68, 70 in place. This etching process exposes a surface of the first selective oxide layer 64 which will be used in later removing the first selective oxide layer. A second selective oxide layer 76 is deposited, again preferably in a liquid phase deposition process. Preferably, the second selective oxide layer 76 is deposited in a timed process step so that a thickness of oxide about equal to the thickness of the first selective oxide layer is deposited, forming second openings around the photoresist mask elements 68, 70 in the second selective oxide layer 76 which extend above the second polysilicon fins 72, 74 and which define the extent of a second step in the lower capacitor electrode that provides a desirable increase in the surface area used for charge storage.

Figure 9:
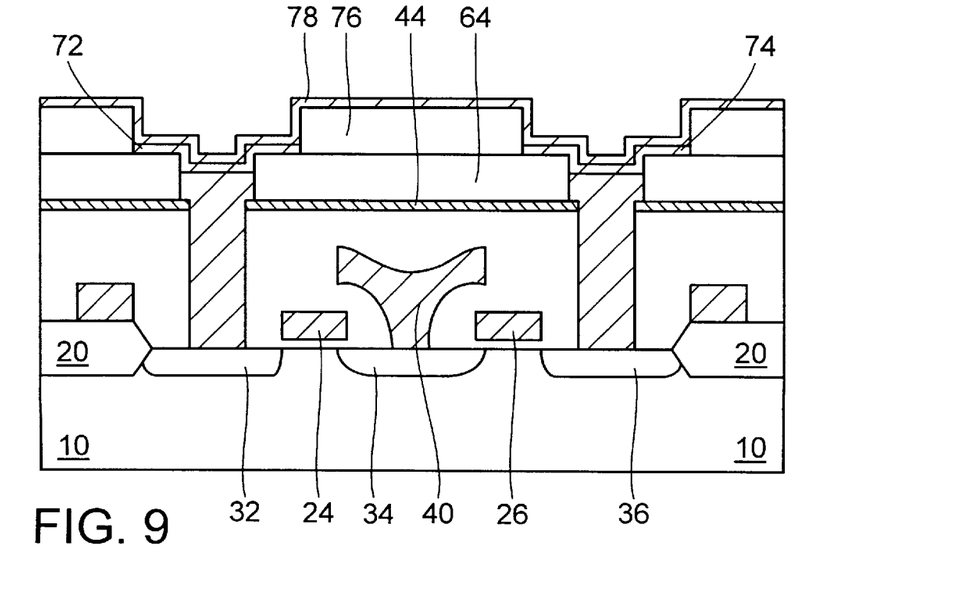
Figure 10:
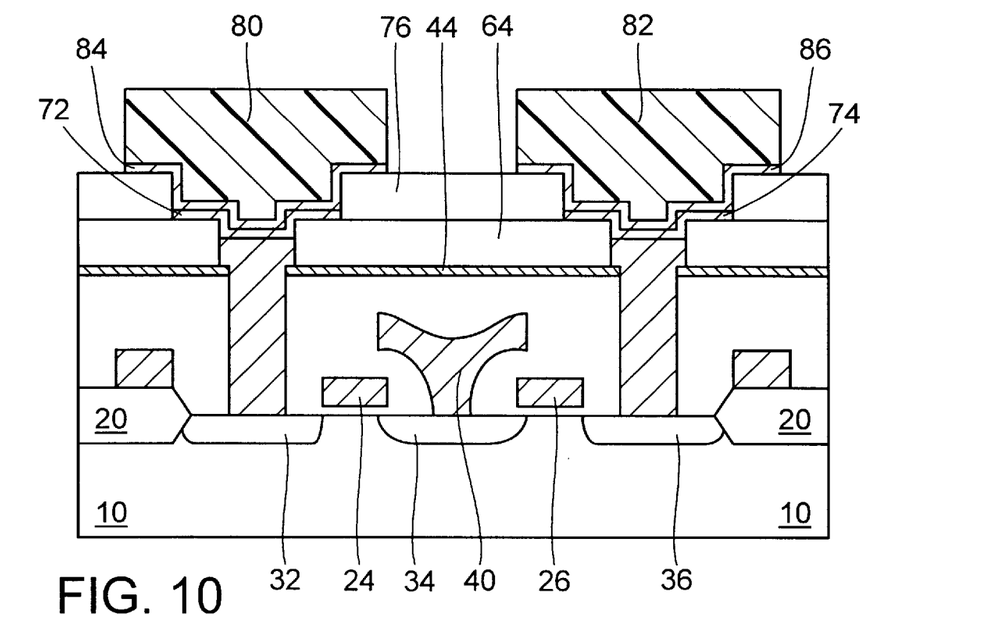

The second photoresist mask elements 68, 70 are then removed by stripping or ashing. A third doped polysilicon layer 78 is deposited in a manner similar to that used for depositing the second polysilicon layer (FIG. 9). Third photoresist mask elements 80, 82 (FIG. 10) are then provided over the third polysilicon layer. Preferably, the third photoresist mask elements 80, 82 are wider than the second polysilicon fin structures. Etching is performed to define the lateral extent of the third polysilicon layer to form third polysilicon fin structures 84, 86. This etching process exposes the second selective oxide layer in a manner that facilitates the removal of the second selective oxide layer and the first selective oxide layer. Referring to FIG. 11, the second selective oxide layer and then the first selective oxide layer are removed from between and beneath the lower capacitor electrode structures. Preferably, these selective oxide layers are removed in a wet etching process using a dilute hydrofluoric acid (HF) solution or a buffered oxide etch. The silicon nitride etch stop layer 44 limits the extent of the chemical etching process. It is possible to use an isotropic dry etch to remove the selective oxide layers, but such dry etching methods are likely to cause a higher level of damage to the polysilicon of the fin structures. The result of the etching process is the two lower capacitor electrodes 88, 90 connected to the transfer FETs through vertical interconnects. The finned lower capacitor electrodes 88, 90 are spaced from the etch stop layer 44 by a sufficient extent to facilitate the further processing steps used to complete definition of the charge storage capacitor.

Figure 12:
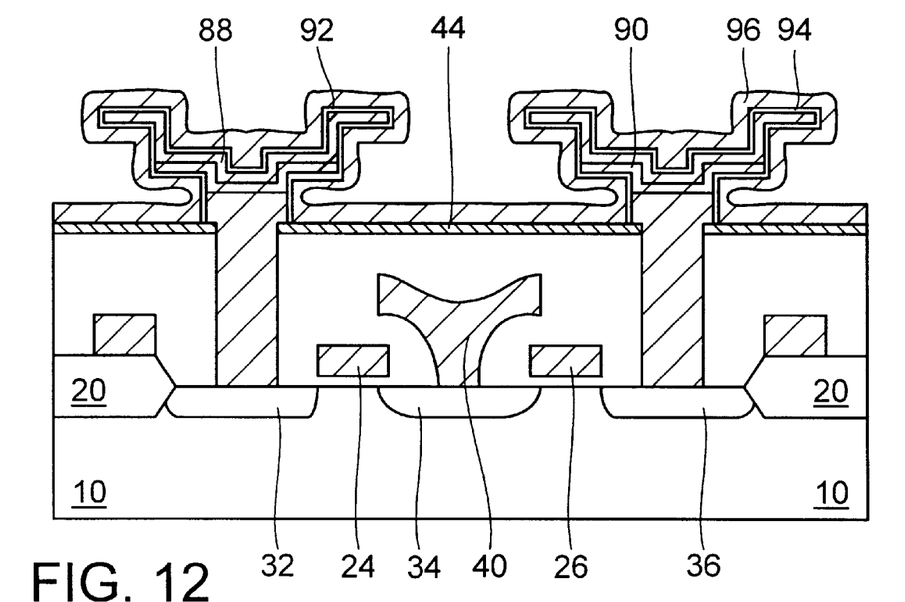

Next, a layer of capacitor dielectric material 92, 94 is provided over the surfaces of the lower electrodes 88, 90. A capacitor dielectric material might be provided by depositing a thin layer of (~30–50 Å) of CVD silicon nitride and growing a thin layer of oxide (~5–15 Å) on the nitride layer to form the dielectric material known as "NO." In particularly preferred embodiments of the present invention, a higher dielectric constant capacitor dielectric material is chosen. In an alternate embodiment, a layer of tantalum pentoxide, nominally $Ta_2O_5$, is deposited in a chemical vapor deposition (CVD) process from a source gas mixture consisting of $Ta(OC_2H_5)_5+O_2$. The tantalum pentoxide capacitor dielectric might be deposited in a high density deposition system such as the LAM 9800 Integrity system to a thickness of between about 20–140 Å. The particular thickness chosen for the capacitor dielectric is preferably thin to maximize the resulting capacitance but sufficiently thick to ensure that the capacitor dielectric layer 94 does not have unacceptable pin holes or an unacceptable breakdown voltage. Because the preferred capacitor dielectric layer is deposited at least in part by CVD, the capacitor dielectric layer 92, 94 will typically extend over the surface of the etch stop layer 44 (not shown). Upper capacitor electrodes are next formed over the DRAM structure in accordance with preferred embodiments of the present invention. For most embodiments, the upper capacitor electrode 96 includes a layer of doped polysilicon deposited to a thickness of 1500–2500 Å. When a tantalum pentoxide capacitor dielectric is used, it is preferred that titanium nitride (TiN) be used to form at least the lower surface of the upper capacitor electrode. Most often, the entire upper capacitor electrode can be formed from titanium nitride due to the high conductivity of titanium nitride. Most preferably, the titanium nitride is deposited over the capacitor dielectric in a low temperature process. Such a low temperature process is preferred because the high dielectric constant capacitor dielectrics preferably used in the present invention typically include oxygen as a constituent element. Thus, any high temperature processes can cause oxide to form at the surface of the lower capacitor electrode 88. Any such oxide layer formed will constitute a reduced capacitance in series with the capacitance provided by the high dielectric constant material, which would undesirably reduce the capacitance of the DRAM charge storage capacitor. Accordingly, the titanium nitride layer is preferably deposited to a thickness of 1000 Å or less using a sputtering process and a relatively low substrate temperature or, more preferably, the titanium nitride layer is deposited in a metal organic chemical vapor deposition (MOCVD) process. Titanium nitride can be deposited by MOCVD from $TiCl_4+NH_3$ source gases at a comparatively low substrate temperature. The MOCVD process has the further advantage over sputtering that MOCVD is much less likely to heat the deposition substrate during the deposition process.

The present invention has been described in terms of certain preferred embodiments. Those of ordinary skill in the art will appreciate that certain modifications and variations on the embodiments described herein may be made within the general spirit of the present invention. As such, the scope of the present invention is not to be limited to the particular embodiments described herein. Rather, the scope of the present invention is to be determined from the claims which follow.

What is claimed:

1. A method of making an integrated circuit device comprising the steps of:

providing a substrate with a transfer field effect transistor on a surface of the substrate, the transfer field effect transistor having first and second source/drain regions;

covering the transfer field effect transistor with a first layer of insulating material;

providing a first layer of conductive material over the first layer of insulating material, the first layer of conductive material being connected to the first source/drain region;

providing a first mask on the first layer of conductive material;

removing the first layer of conductive material where exposed by the first mask;

performing selective deposition of a second layer of insulating material over the substrate, the selective deposition providing portions of the second layer of insulating material around the first mask and over portions of the substrate above which the first layer of conductive material was removed, the selective deposition leaving an upper surface of the first mask not covered by the second layer of insulating material;

removing the first mask to expose a surface of a remaining portion of the first layer of conductive material, the second layer of insulating material having a first opening around the remaining portion of the first layer of conductive material;

depositing a second layer of conductive material on the first layer of conductive material and over the second layer of insulating material;

patterning the second layer of conductive material, to form a conductive fin that extends substantially in a plane that is essentially parallel to an upper surface of said substrate, said patterning exposing a portion of the second layer of insulating material;

removing the second layer of insulating material from below the second layer of conductive material;

forming a dielectric layer over exposed surfaces of the first layer of conductive material and the second layer of conductive material; and forming a conductive upper electrode over the dielectric layer.

2. The method of claim 1, further comprising the steps of:

providing a stop layer over the first layer of insulating material, the first layer of conductive material being deposited above the stop layer; and using the stop layer to define an etch stop point in a chemical process used to remove the second layer of insulating material.

3. The method of claim 2, wherein the second layer of insulating material is an oxide and the chemical process is a wet etching process.

4. The method of claim 3, wherein the wet etching process uses an etchant including hydrofluoric acid or which is derived from hydrofluoric acid.

5. The method of claim 4, wherein the stop layer comprises silicon nitride.

6. The method of claim 2, wherein the stop layer is deposited on a planarized surface of the first layer of insulating material.

7. The method of claim 6, wherein at least the surface of the first layer of insulating material comprises silicon oxide.

8. The method of claim 6, wherein a contact via is formed through the stop layer and the first layer of insulating material, the contact via being filled with an interconnect conductor, the interconnect conductor connected to the first layer of conductive material.

9. The method of claim 8, wherein at least a portion of the first mask is aligned over the first source/drain region.

10. The method of claim 9, wherein the interconnect conductor comprises doped polysilicon.

11. The method of claim 10, wherein the first layer of conductive material is doped polysilicon deposited in the same deposition process with the interconnect conductor.

12. The method of claim 11, wherein the selective deposition process comprises a liquid phase deposition of silicon oxide.

13. The method of claim 10, wherein the second source/drain region is connected to a doped polysilicon bit line contact.

14. The method of claim 10, wherein the second source/drain region is connected to a bit line contact configured in a capacitor over bit line DRAM cell.

15. The method of claim 1, wherein the first mask comprises photoresist and wherein the selective deposition process comprises a liquid phase deposition of silicon oxide.

16. The method of claim 1, wherein the first opening in the second layer of insulating material rises above the first layer of conductive material by a distance greater than a thickness of the second layer of conductive material.

17. The method of claim 1, further comprising the following steps performed before the step of removing the second layer of insulating material:

providing a second mask on the second layer of conductive material;

removing the second layer of conductive material where exposed by the second mask, thereby patterning the second layer of conductive material;

performing selective deposition of a third layer of insulating material over the substrate, the selective deposition providing portions of the third layer of insulating material around the second mask and over portions of the substrate above which the second layer of conductive material was removed, the selective deposition leaving an upper surface of the second mask not covered by the third layer of insulating material;

removing the second mask to expose a surface of a remaining portion of the second layer of conductive material, the third layer of insulating material having a second opening around the remaining portion of the second layer of conductive material;

depositing a third layer of conductive material on the second layer of conductive material and over the third layer of insulating material;

patterning the third layer of conductive material, thereby exposing a portion of the third layer of insulating material; and removing the third layer of insulating material from below the third layer of conductive material.

18. A method of making an integrated circuit device comprising the steps of:

providing a substrate with a transfer field effect transistor on a surface of the substrate, the transfer field effect transistor having first and second source/drain regions;

covering the transfer field effect transistor with a first insulating layer;

providing an etch stop layer over the first insulating layer;

opening a contact via through the etch stop layer and through the first insulating layer to expose the first source/drain region;

providing a vertical interconnect within the contact via;

providing a first polysilicon layer over the etch stop layer, the first polysilicon layer being connected to the first source/drain region through the vertical interconnect;

providing a first mask on the first polysilicon layer;

etching the first polysilicon layer using the first mask;

selectively depositing a second insulating layer over the substrate, the step of selectively depositing leaving an upper surface of the first mask not covered by the second insulating layer;

removing the first mask to expose a surface of a remaining portion of the first polysilicon layer, the second insulating layer having a first opening around the remaining portion of the first polysilicon layer;

depositing a second polysilicon layer on the first polysilicon layer and over the second insulating layer;

patterning the second polysilicon layer, to form a conductive fin that extends substantially in a plane that is essentially parallel to an upper surface of said substrate, said patterning exposing a portion of the second insulating layer;

removing the second insulating layer from below the second polysilicon layer using the etch stop layer to limit the step of removing the second insulating layer;

forming a dielectric layer over exposed surfaces of the first polysilicon layer material and the second polysilicon layer; and forming a conductive upper electrode over the dielectric layer.

19. The method of claim 18, wherein a surface of the first layer of insulating material is planarized.

20. The method of claim 18, wherein the second insulating layer is an oxide and the step of removing includes a wet etching process.

21. The method of claim 18, wherein the etch stop layer comprises silicon nitride.

22. The method of claim 18, wherein at least the surface of the first insulating layer comprises silicon oxide.

23. The method of claim 18, wherein at least a portion of the first mask is aligned over the vertical interconnect.

24. The method of claim 18, wherein the second source/drain region is connected to a bit line contact configured in a capacitor over bit line DRAM cell.

25. The method of claim 18, wherein the first mask comprises photoresist and wherein the step of selectively depositing process comprises a liquid phase deposition of silicon oxide.

26. The method of claim 18, wherein the first opening in the second insulating layer rises above the first polysilicon layer by a distance greater than a thickness of the second polysilicon layer.

* * * * *